United States Patent [19]

Giubardo

[11] Patent Number: 4,812,851
[45] Date of Patent: Mar. 14, 1989

[54] RADIO RECEIVER WITH AUTOMATIC INTERFERENCE CANCELLATION

[75] Inventor: Mark J. Giubardo, Pepperill, Mass.

[73] Assignee: Digital Marine Electronics Corporation, Acton, Mass.

[21] Appl. No.: 793,181

[22] Filed: Oct. 31, 1985

[51] Int. Cl.$^4$ ............................................... G01S 1/24
[52] U.S. Cl. ..................................... 342/389; 455/307
[58] Field of Search .......................... 342/389; 455/307; 330/151, 126

[56] References Cited

U.S. PATENT DOCUMENTS

| | | | |
|---|---|---|---|
| 3,281,698 | 10/1966 | Rose, Jr. et al. | 455/307 |
| 3,744,015 | 7/1973 | Marimon et al. | 455/307 |
| 4,539,566 | 9/1985 | Sharpe et al. | 342/389 |
| 4,549,312 | 10/1985 | Michaels et al. | 455/307 |

OTHER PUBLICATIONS

IEEE Standard Dictionary of Electrical and Electronics Terms, 3rd Edition, 1984, pp. 22 & 621.
J. Kalb, Georga Institute of Technology, EEE, Feb. 1971, p. 61, "A Novel Active Filter".

Primary Examiner—Theodore M. Blum
Attorney, Agent, or Firm—Robert T. Dunn

[57] ABSTRACT

Undesired, intefering narrow band received signals in a radio receiver are automatically cancelled by a cancellation system including a variable narrow band pass filter that separates a sample of the undersired signals from the total received signal, reverses phase of the sample and combines it with the total received signal, substantially cancelling the undesired signals therein. In a Loran-C receiver, desired beacon signals in the band 90 to 110 KHz are received aling with narrow band interfering (undesired) signals. During a "cancel mode," a narrow band of the total received signal is sampled by a variable narrow band pass filter and the narrow band sample is reversed in phase and then combined with the total received signal to cancel the undersired signals therein. The frequency of the variable narrow band pass filter is controlled by a pass filter control signal that is established during a "search mode" as the control signal at which a high (or maximum) interference signal is detected in the pass filter output. During the cancel mode, that control signal sets the frequency of the variable narrow band pass filter causing the interfering signal to be cancelled. Thus, interference detection during the search mode is accomplished using the same variable, narrow band pass filter as used during the cancel mode to cancel the interference.

51 Claims, 7 Drawing Sheets

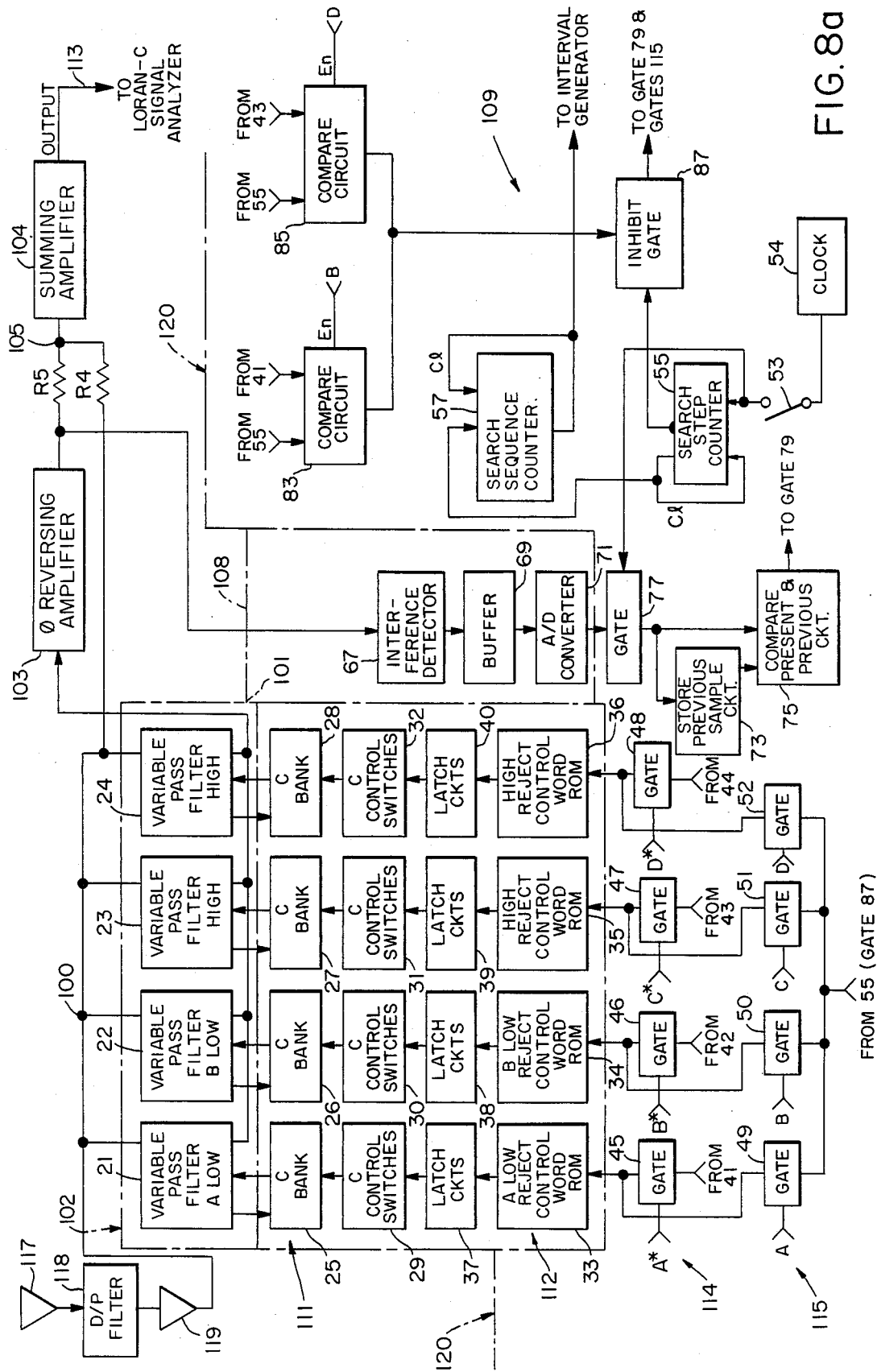

FIG.8b
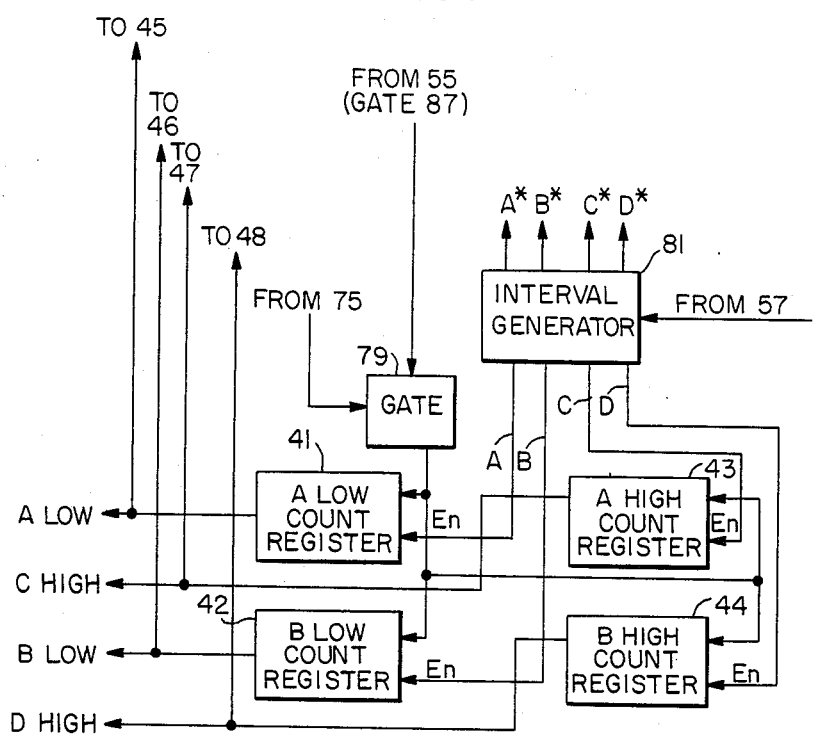
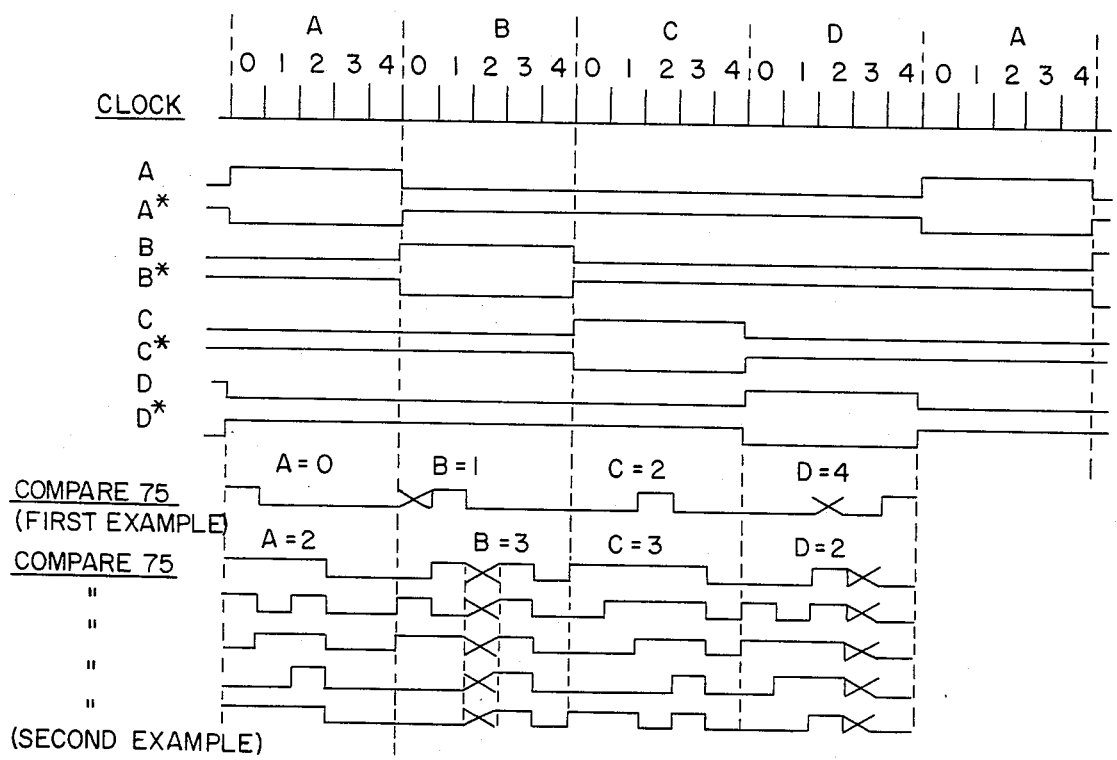
FIG.9

RADIO RECEIVER WITH AUTOMATIC INTERFERENCE CANCELLATION

BACKGROUND OF THE INVENTION

This invention relates to methods and means of reducing noise and undesired signals in a radio receiver and more particularly for reducing an interfering signal among the Loran beacon signals received by a Loran receiver, by cancelling the interfering signal.

One type of interference in a Loran-C receiver takes the form of one or more narrow band signals at the edge of the band of received beacon signals (90 to 110 KHz). These interfering signals may come from other beacons that transmit just outside of the Loran-C band and, although they are outside the band, they are relatively very high peak power and will interfere with the reception of the desired beacon signals. Heretofore, some efforts have been made to reject these narrow band undesired signals by providing a reject filter in the path of the received signals in the Loran receiver, that includes a manually variable capacitor controlled by the Loran receiver operator. Some systems of this sort require the continual attention of a human operator, and are not automatic.

Automatic interference rejection in a Loran-C receiver is described in U.S. Pat. No. 4,549,312 entitled: A Radio Receiver with Automatic Interference and Distortion Compensation, filed Feb. 29, 1980, by Sheldon B. Michaels and the applicant herein. That patent describes a Loran-C receiver wherein beacon signals in the band 90 to 110 KHz are received and fed through several variable low and high narrow band, reject filters that reject the undesired narrow band interfering signals at the edges of the band of received beacon signals during an automatic reject mode. The reject filters are set during an automatic search mode using variable narrow band pass filters that are varied to sweep the low and high edges of the Loran-C band and the sweep control signals for these pass filters when each produces a maximum output is stored. Then, during the cancel mode, the variable low and high reject filters are tuned by these stored control signals. Thus, the variable reject filters are controlled by a feedback system that includes additional tuned filters (the pass filters) to produce control signals for the variable reject filters.

SUMMARY OF THE INVENTION

The present invention includes methods and means of reducing a narrow band undesired signal among the received signals in a radio receiver using a variable, narrow band pass filter controlled by a control signal, wherein the variable narrow band pass filter is used to search for and detect the presence of the undesired narrow band signals in the total received band and then, as part of a signal cancellation system, separate a sample of the total received band at the undesired narrow band so that the cancellation system can reverse phase and amplify the sample and then combine it with the total band of received signals to cancel the undesired narrow band therein.

In embodiments described herein, each of the variable, narrow band pass filters is a variable inductance, capacitance, resistance (LCR) tuned circuit in which the variable element is capacitance or inductance that may be varied by an analog or digital technique. For example, the variable element may be a veri-cap diode controlled by an analog control signal or it may be selected from a bank of capacitors or from a bank of inductors by a digital control number. According to a digital technique which varies capacitance, the variable capacitance is the combined fixed capacitors from a bank of capacitors which are combined in weighted binary multiples by switches controlled by a control word from a digital computer. This type of digital control of tuning is also used as in said U.S. Pat. No. 4,549,312.

One particular embodiment of the present invention described herein is a Loran-C receiver, adapted to operate fully in accordance with the above features of the invention. The usual band of operation of a Loran-C receiver is 90 to 100 KHz and, while this band is relatively flat and drops rather sharply at the ends (see FIG. 5), narrow band interfering signals such as from other beacons will produce substantial power overlapping the Loran-C band and so it is advantageous to cancel them. In the past, this was done with one or more variable, narrow band reject filters, (sometimes called "notch filters") that are set adjacent the Loran-C band, just above and just below it, as done also in said U.S. Pat. No. 4,549,312.

The band pass of a typical Loran-C receiver is illustrated by FIG. 5. This is a plot of power versus frequency showing an essentially flat band from 90 to 110 KHz. Intense narrow band interfering signals are shown at the edges of the Loran-C band, each producing some interfering power in the band. These represent typical narrow interfering bands of transmission that are sometimes within the range of a Loran-C receiver and can interfere with reception of Loran-C beacon signals. When they are rejected, the band appears as shown by FIG. 5.

According to an embodiment of the present invention, a Loran-C receiver receives desired beacon signals in the band 90 to 110 KHz along with narrow band interfering (undesired) signals immediately below and above the band. During the search mode, each of four variable narrow band pass filters are successively tuned either below or above the 90 to 110 KHz band and the pass filter control number that controls the filter frequency at which the pass filter output is maximum is stored as that pass filter control number and is representative of the frequency of the maximum uncancelled interference signal in the band swept. During the cancel mode, the same variable narrow band pass filter is set by the stored control number and samples the narrow band of the total received signal, the sample is fed to a phase reversing amplifer of predetermined gain and then combined with the total signal in a summing amplifier to cancel the undesired signal therein. Thus, interference detection during the search mode is accomplished using the same variable, narrow band pass filter as used in the cancellation system during the cancel mode.

It is a principle object to the present invention of provide an improved method and means of reducing narrow band interference signals in a radio receiver.

It is another object to provide a method and means of automatically searching for a narrow band interfering signal in a radio receiver and cancelling it.

It is another object to provide a method and means of automatically searching for interference in a radio receiver, locating the frequency of the interference and reducing it.

It is a particular object of the present invention to provide a method and means for automatically searching for, locating and eliminating an undesired narrow band signal in a Loran-C receiver using fewer variable narrow band filters than in the above described prior Loran-C receiver.

It is another object of the present invention to provide a method and means for automatically searching for, locating and eliminating such an undesired narrow band signal in a Loran-C receiver using the same variable narrow band filter used to eliminate an interfering signal to also search for and locate the interfering signal.

It is another object to provide an improved Loran-C receiver wherein in a narrow band, interference signal at the edges of the Loran-C receiver band is automatically searched out and eliminated by the same circuit.

Other features and objects of the present invention will be apparent in view of the following description of embodiments including an embodiment that represents that best known use of the invention and incorporates all features of the invention, taken in conjunction with the drawings.

DESCRIPTION OF THE DRAWINGS

FIG. 8a and 8b together are a structural block diagram showing details of the controls and systems of the Loran-C receiver of FIG. 7 for automatically cancelling two narrow bands of interfering signals below and two above the Loran-C band;

FIG. 9 shows a series of waveforms that illustrate clock pulses, search step count intervals, search sequence intervals A, B, C and D and the operation of compare circuits.

DESCRIPTION OF EMBODIMENTS OF THE INVENTION

RADIO RECEIVER—INTERFERANCE CANCELLATION

Figure 1:
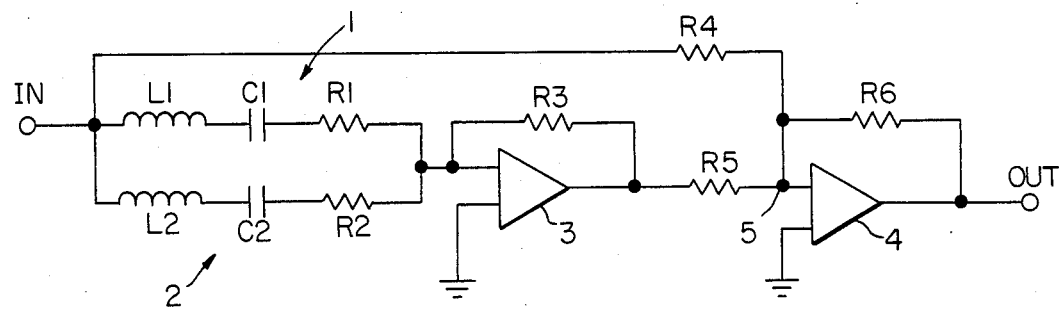
FIG. 1 is a circuit diagram of the input of a radio receiver for cancelling two narrow frequency bands of the broader input band of signals, incorporating features of the present invention.
Figure 2:
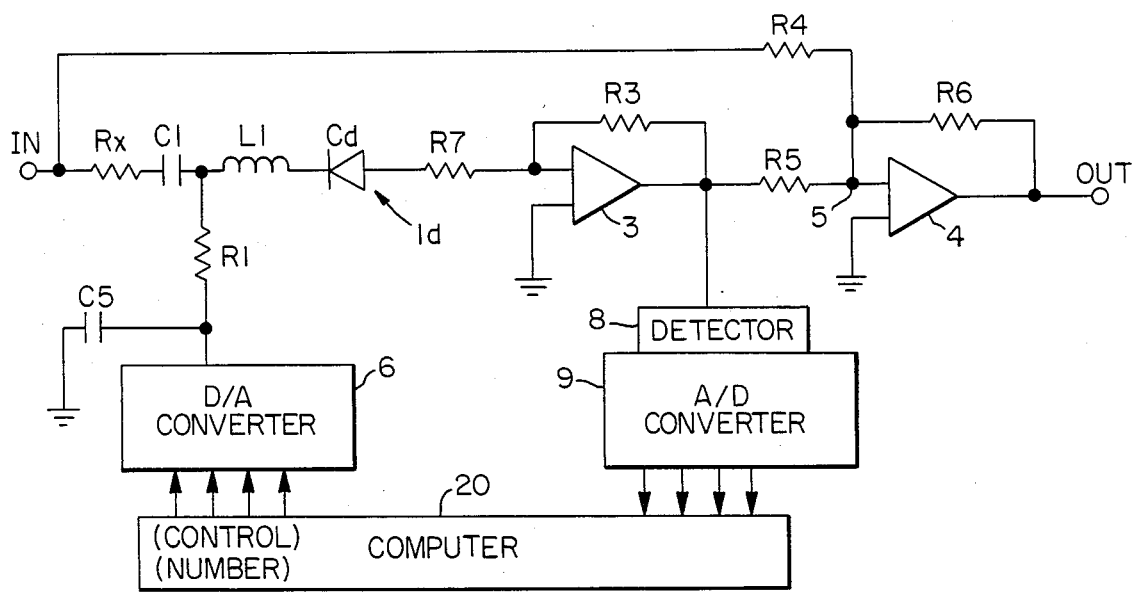
FIG. 2 is a circuit and partial block diagram of the input of a radio receiver for cancelling a narrow frequency band of interference signals of the input band of signals using a voltage variable diode as the variable capacitance of the variable input pass band filter, controlled by an analog feedback signal from a computer to perform search and cancel modes.
Figure 3:
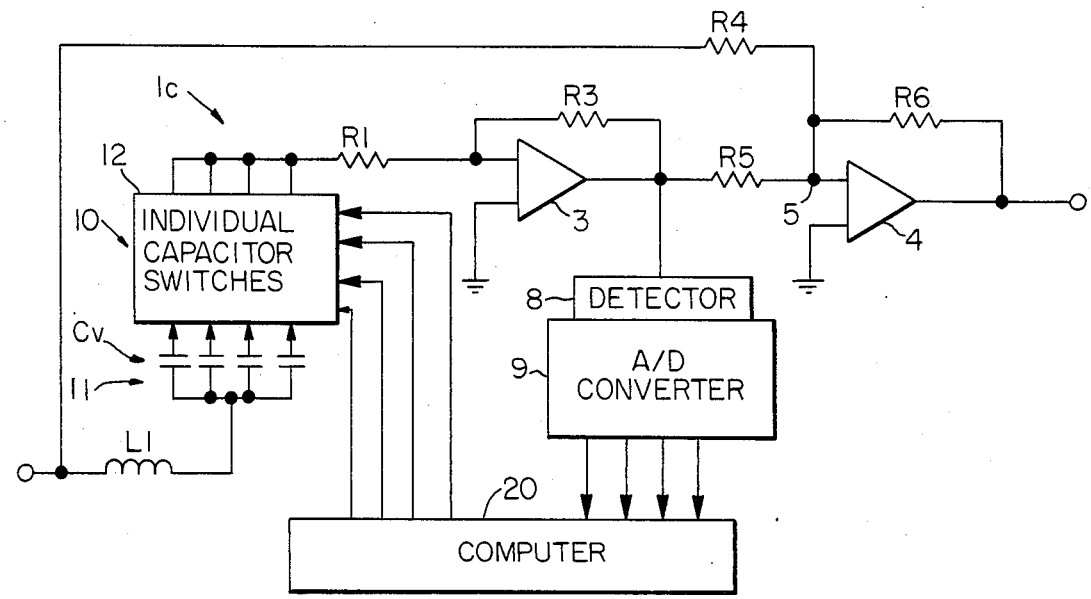
FIG. 3 is a circuit and partial block diagram of the input of a radio receiver for cancelling a narrow frequency band of interference signals of the input band of signals using a band of fixed capacitors from which capacitors are selected for the variable input pass band filter, controlled by a digital control number from a computer to perform search and cancel modes.
Figure 4:
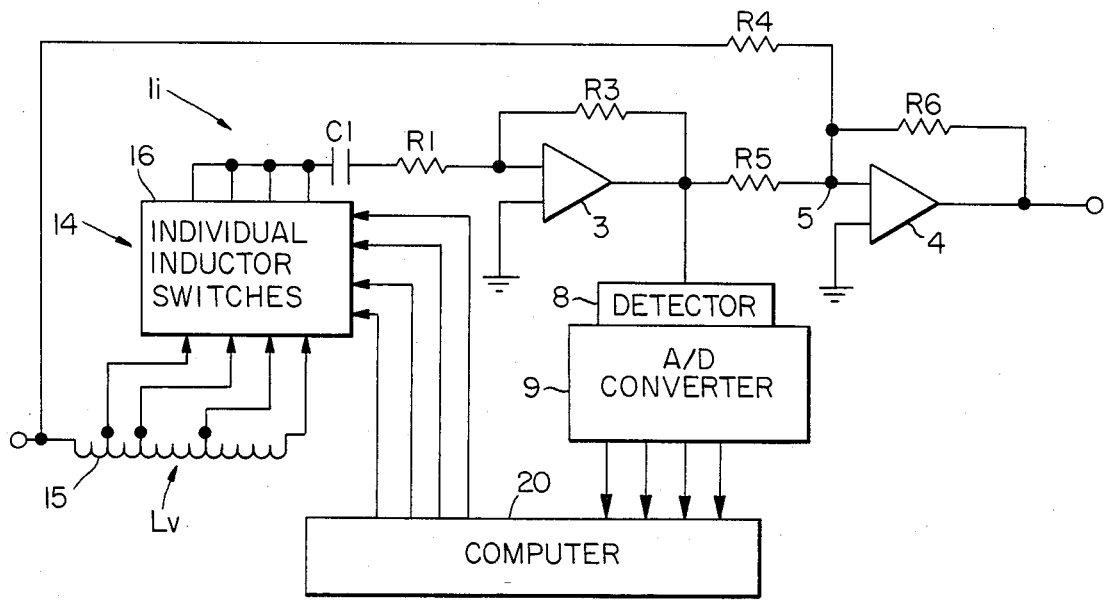
FIG. 4 is a circuit and partial block diagram of the input of a radio receiver for cancelling a narrow frequency band of interference signals of the input band of signals using a bank of fixed inductors from which an inductance is selected for the variable input pass band filter, controlled by a digital control number of a computer to perform search and cancel modes.
Figure 5:
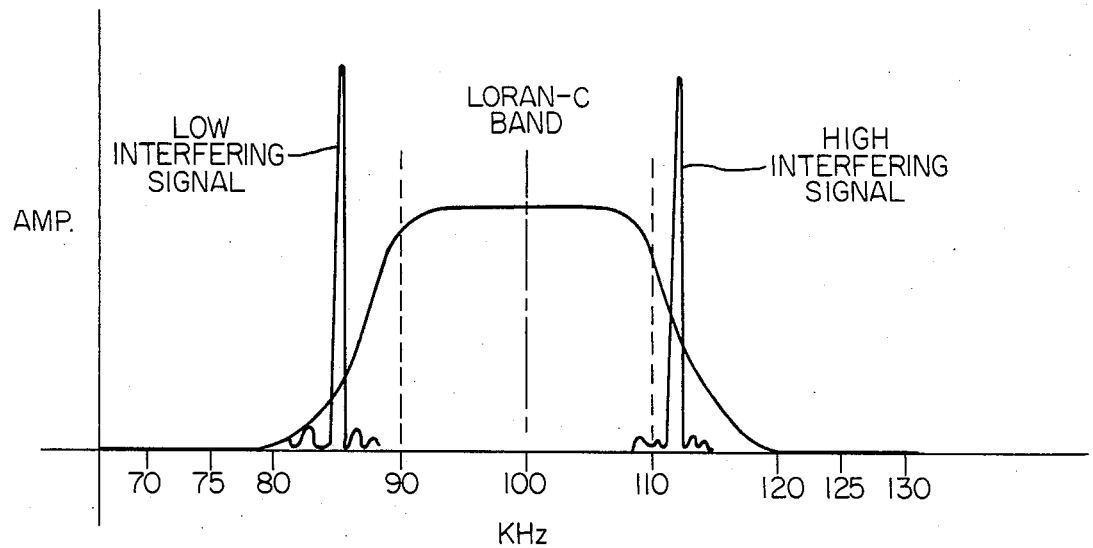
FIG. 5 shows the frequency band width of a Loran-C receiver and narrow band interfering signals below and above the band of the kind that can be automatically cancelled by incorporating features of the present invention in the receiver.
Figure 6:
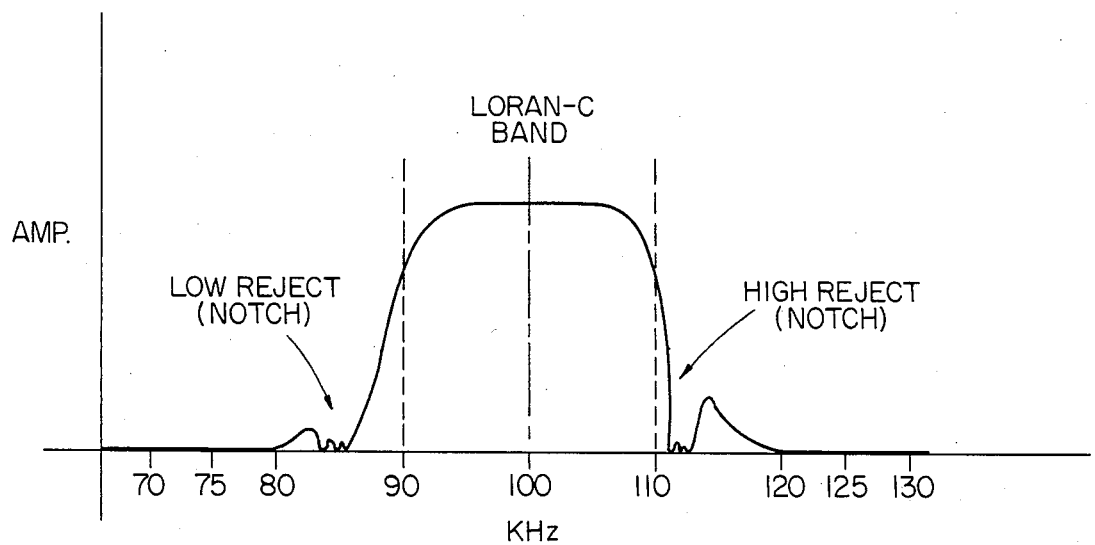
FIG. 6 shows the frequency band of the same Loran-C receiver with cancellation of the interfering narrow band signals below and above the Loran-C band by a low and high narrow band cancellation system, according to the present invention.

FIG. 1 shows the input of a radio receiver for cancellation of two narrow bands of the receiver input band in accordance with features of the invention. The technique in FIG. 1 and the analog and digital control variations shown in FIGS. 2, 3 and 4 are designed to do the following:

1. Produce a very narrow band pass filter;
2. Produce a very deep cancellation of the narrow band;
3. Generate as little noise as possible;
4. Have high dynamic range;
5. Use as few components as possible;
6. Allow as many or as few cancelled bands of frequency (notches) as necessary for the particular application with a minimum of parts;
7. Be easily tuned with a minimum of components;
8. Be relatively low in cost;
9. Have independent cancelled narrow bandwidths; and
10. Have an output peak response coincident with the cancelled frequency band that allows monitoring the signal that is being cancelled if desired.

The circuit shown in FIG. 1 includes two different input pass fillers for producing from an input at IN an output at OUT with two cancelled narrow frequency bands (notches) in the output. The pass filters 1 and 2 are each LCR filters and include L1, C1, and R1 in filter 1 and L2, C2, and R2 in filter 2.

In filter 1, inductor L1 and capacitor C1 are tuned to a narrow frequency band to be cancelled. At resonance, they have minimum attenuation and no phase shift. Resistor R1 in conjunction wiht the L1/C1 ratio sets the bandwidth of filter 1. Amplifier 3 amplifies the sample of the input signal allowed through L1-C1 with a gain determined by the ratio of the amplifier feedback resistor R3 divided by R1, and also inverts the phase of the sample. The sample is then passed through R5 to the summing point 5 of summing amplifier 4. The input signal at IN (the total received signal) from which the undesired narrow frequency bands are to be removed is applied through R4 to summing point 5. The ratio of R4 to R5 is such that an undesired narrow band through both resistors R4 and R5 produces equal currents through the resistors, but these currents are 180 degrees out of phase. The result is cancellation of the undesired narrow band in the total received signal at summing point 5. This cancellation is limited only by the degree of balance between the two signal paths. At frequencies only a little removed from the resonance of L1-C1, the currents in R4 and R5 are no longer 180 degrees out of phase, so the attenuation by cancellation of the circuit drops off quickly. A benefit of this circuit is that the effective "Q" of L1-C1 increases greatly over the actual "Q" of L1-C1. Another benefit is that the output of phase reversing amplifier 3 contains the lower "Q" response of the tuned circuit as a bandpass amplifier so that its output can be monitored and the frequency of the narrow band to be cancelled can be measured.

Narrow band pass filter 2 operates like pass filter 1 to cancel another narrow frequency band. Of these pass filters, the following may be: R1=R2, C1=C2, but L1=L2; or R1=R2, L1=L2 and C1=C2.

As shown in FIG. 2, the frequency of a cancelled narrow band (notch) in the output may be adjustable by for example, replacing the capacitor of the pass filter with a combination fixed capacitor C1 and veri-cap tuning diode Cd and applying a suitable dc bias through R1 to the diode and in this way tune pass filter $1d$ to the narrow band to be cancelled. The bias is provided from a digital to analog (D/A) converter 6 receiving a control number from computer 20 that contains a microprocessor from which the computer selects a control number during the cancel mode of operation. In this system, the computer schedules the cancel mode and the search mode of operation.

Also in FIG. 2, the output of amplifier 3 is relatively large when filter $1d$ is tuned to a large interfering signal. That output is detected by detector 8 of analog to digital (A/D) converter 9 which is input to the microprocessor of computer 20. During the search mode, the computer steps through a sequence of pass filter control numbers to D/A converter 6 searching for a high intensity undesired narrow band. At each search step, the magnitude of the output of filter $1d$ is detected and converted to an intensity number by A/D converted 9 that is representative of the intensity of the band. The computer stores the control number at which the greatest (maximum) intensity is detected. That stored control number is then used during the cancel mode to control Cd and so the narrow band undesired band of greatest intensity is cancelled in the total received signal output.

As shown in FIG. 3, the capacitance of the variable narrow pass band filter is replaced with a "digital control number to capacitance converter" 10, that may be similar to such a converter described in said U.S. Pat. No. 4,549,312. Here, the variable pass filter 1c includes capacitance Cv selected from a bank of fixed binary weighted capacitors 11, depending on the setting of switches 12 by a control number from computer 20.

As shown in FIG. 4, the inductance of the variable narrow pass band filter $1i$ is replaced with a digital control number to inductance converter 14. Here, the variable pass filter $1i$ includes inductance Lv selected from the series of fixed binary weighted inductors 15, depending on the setting of switches 16 by a control number from computer 20. This is similar to FIG. 3 in that the computer microprocessor sets inductance converter 14 and so provides a variable, narrow band pass filler that is inductance tuned.

In the examples shown in FIGS. 1 to 4, the voltage across the reactive elements of the series tuned circuit is equal to the loaded Q times the applied voltage. They are high Q notch filters and so the voltage rise can be several hundred times the input voltage. If a veri-cap diode is used as in FIG. 2 as one of the tuning element, severe degradation of the notch in the output produced by the cancellation will occur if the amplitude of the narrow band to be removed becomes more than a small fraction of the bias voltage necessary to keep the diode at the correct capacitance. If the amplitude of the signal to be cancelled becomes even larger, the notch may disappear (the undesired signal reappears) and if the signal level is increased even further, the veri-cap diode will become forward biased and severe distortion may result. In the past, this characteristic of veri-cap diodes has limited their use in a notch filter to receivers that have low dynamic range. According to a feature of the present invention, it is possible to greatly improve that situation as follows:

First the Q multiplication effect that the circuit has allows operation at lower loaded Q than is ordinarily done, thereby lowering the voltage increase across the veri-cap diode.

Second, by inserting an attenuator Rx at the input in FIG. 2 the narrow band to be cancelled is reduced in level. Then the gain of amplifier 3 is increased in proportion to the magnitude of Rx.

This does not alter the notch in the output except to lower the magnitude of narrow band signals that the cancellation system can handle. There is little effect on the desired part of the total received signal since it is not passed by tuned circuit 1d and so most of the desired signal goes through R4 to amplifier 4.

Loran C Receiver

System—Cancellation of Low and High Narrow Bands

As mentioned above, a Loran-C receiver receives desired beacon sognals in the band 90 to 110 KHz. The radio frequency (RF) part of a Loran-C receiver incorporating features of the present invention are illustrated by FIGS. 7 to 10. It includes a set of four variable narrow band pass filters, a cancellation circuit similar to the curcuit in FIG. 3 and a computer that programs and controls operation in the search mode and the cancel mode. In the search mode, a variable narrow band pass filter samples the received band and is stepped or swept through a band immediately below (75 to 90 KHz), or immediately above, (110 to 125 KHz), the Loran-C band in search of the maximum interfering signal in the searched band and a pass filter control number representative of the equivalent to the frequency of the pass filter when the maximum interference is detected in the output of the phase reversing amplifier is used to tune the pass filter. This control number may be a binary number and is used by the computer to set the variable capacitance of the pass filter during the cancel mode. Thuse, each variable narrow band pass filter is used to search out the maximum interference during its search mode and cancel that interference during its cancel mode.

The variable capacitance of the pass filter is selected from a bank of binary weighted capacitors the selection being done by pass filter control numbers from the computer. For example, during the search mode, the computer produces a sequence of the control numbers causing switches to the bank of capacitors to step through combinations of the capacitors (pass filter capacitance values) that vary the center frequency of the pass filter in small steps, recording as it goes the intensity of the output of the phase reversing amplifier for each control number from the computer. In this way, the most intense (maximum) interfering signal is searched for and identified by the corresponding control number from the computer that sets the frequency of the pass filter to the frequency of the maximum interfering signal.

The embodiment described herein includes two low variable narrow band pass filters for searching and cancelling interfering signals in a band below the Loran-C band and two high variable band pass filters for searching and cancelling interfering signals in a band below the Loran-C band. All of these filters operate essentially the same in conjunction with the cancellation circuit.

In the cancel mode, a variable band pass filter capacitor bank controlled by the computer sets the filter frequency at a maximum interfering signal in the low or the high band (below or above the Loran-C band) and that interfering signal is cancelled. According to one method of operation, search mode may be repeated regularly to be sure that the high and low pass filters are set at the maximum interfering signals. According to another method of operation, the signal to noise (S/N) ratio of the net received signal from the summing amplifier may be continually monitored to be sure that the cancellation is effective, and if there is a degradation of the S/N ratio, then the system goes back to the search mode. In either case, cancellation occurs continually, even during the search mode.

The technique used to tune a variable pass filter during the cancel mode is also used to turn it during the search mode and so, for the most part, the same circuits are used for both modes. Also, cancellation occurs even during the search mode. For example, at any instant during the search, the narrow band that the pass filter is tuned to is cancelled by the summing amplifier following the phase reversing amplifier, unless the summing step is eliminated during the search mode.

Search and Cancellation—System Details

Figure 7:
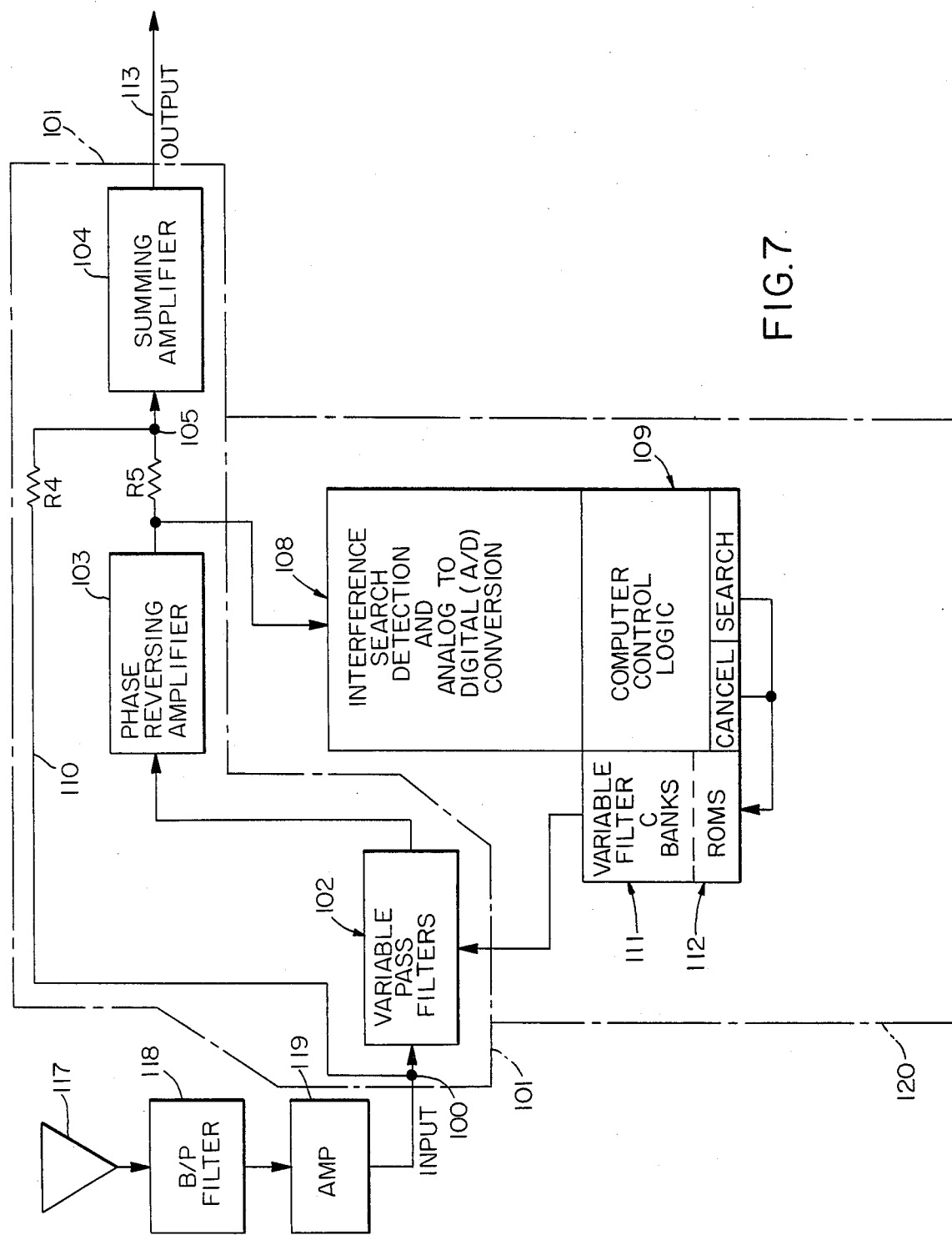
FIG. 7 is a block diagram illustrating the functions and systems of a Loran-C receiver incorporating features of the present invention.

Turning to FIG. 7 there is shown a functional block diagram of a Loran-C receiver incorporating the principle features of the present invention. Only the RF portion of the Loran-C receiver is shown here, because it is that portion to which the features of the present invention apply.

Loran beacon RF signals in the band 90 to 110 KHz from the receiver antenna 117 are fed through the receiver band pass filter 118 to RF amplifier stage 119. The output of amplifier 119 is the input 100 to cancellation system 101 and is the RF signal received within the band of filter 118 and may include relatively narrow band interfering signals some of which may be just at the edges of the band. Interfering signals at the edges of the band will contain frequencies that overlap the band. It is one object of the present invention to find those narrow band interfering signals and cancel them that they are not included in the RF output of the receiver.

The RF input signals at 100, including interference, are subject to cancellation by the variable cancellation filter system 101. That system includes four variable LCR (inductance, capacitance and resistance) variable, narrow band pass filters 102 that are set by variable C (capacitance) banks 111. The output of pass filters 102 is fed to phase reversing amplifier 102 and from the output of 103 through R5 to summing point 105 of summing amplifier 104. At the same time, the input at 100 is fed by line 110 through R4 to summing point 105. The output from amplifier 104 is the total input with notches where cancellation occurs at the frequencies of the pass filters 102.

During the search mode, for one of the variable band pass filters, interference is searched out, detected and measured by system 108 of computer 120 that detects the magnitude (intensity) of the output of amplifier 103 and produces a digital number representative of that intensity. That number is the undesired signal intensity number and is stored in computer 120. Meanwhile, the control logic circuits 109 in computer 120 produce the pass filter control numbers that are fed to the pass filter ROM in ROMs 112 that produce C bank control words for the pass filter. The C bank control words control the pass filter capacitance and so determine the frequency it is centered at. The pass filter then remains at the frequency set by its capacitance until the next search sequence.

The control logic of circuits 109 during the search mode sequence can step the two low and the two high pass filters through the search ranges in any order. For example, the logic may step first the low and then the high variable pass filters of 102 through the low and then high bands (below and above the Loran-C band). Meanwhile, during the search mode for each pass filter, control logic circuits 109 compare the present and the previous signal intensity numbers and identifies the most intense or maximum intensity during that search sequence. Logic circuits 109 fed the control number that corresponds to the maximum intensity to ROMs 112. In ROMs 112, the ROM for the pass filter going through the search sequence produces a control word that selects capacitance from its associated C bank of C banks 111.

During search, cancellation goes on even though the low and high notches are not placed at the maximum interfering signal for all steps of the search sequence. Thus, the cancel mode is continuous and the search mode may be turned on and off as needed or may be scheduled automatically by control logic circuits 108. Clearly, other techniques could be used to initiate search For example, search could be initiated only when excessive interfering signals are detected in output 113 and the cancel mode could begin only at the end of the search mode.

Turning next to FIG. 8a and 8b, there is shown a detailed block diagram of the portion of the same Loran-C receiver as shown in FIG. 7. Four narrow pass band filters 21 to 24 are provided in filters 102, two at each end of the 90 to 110 KHz band of the Loran-C receiver. More particularly, two variable pass filters, 21 and 22, are provided at the low end of the band for cancelling in the range 75 to 90 KHz and two filters, 23 and 24, are provided in the upper end of the band in the range 110 to 125 KHz. These narrow pass band filters 21 to 24 are designated A Low, B Low, C High and D High, respectively. These same filters are used for the search mode, two for searching the low end and two for searching the high end.

As shown in FIG. 8a and 8b, interference cancellation is performed by cancellation system 101 including narrow pass band filters, 21 to 24, phase reversing amplifier 103 and summing amplifier 104. The variable capacitance for each of these filters in C banks 111, denoted C banks 25 to 28, are incorporated into their respective filters through switches 29 to 32 that are controlled by control words from ROMs 33 to 36, via latch circuits 37 and 40, respectively. The variable pass filters 21 to 24 each sample a narrow band of the total received RF signal at input 100 including interfering signals. They sample narrow bands just below and just above the Loran-C beacon band depending on the capacitance coupled to them from their associated C bank 25 to 28.

During the cancel mode, variable pass filters 21 to 24 remain set at the frequencies called for by the search step count numbers stored in registers 41 to 44, respectively. The search steps for both of the low end pass filters is from low to higher frequency and for the two high pass filters is from high to lower frequency. In this example, first the A low and then the B low pass filters successively step through their range and then the C high and finally the B high pass filters successively step through their range. Thus, the two low pass filters successively step from below the Loran-C operating band (90 to 110 KHz) one after the other, toward the low end thereof and then the two high pass filters step from above the Loran-C operating band, one after the other, toward the high end thereof.

In this example, the search with each pass filter is done in five steps and so the search count number for each range is zero, one, two, three, or four. Search begins with the pass filters placed at positions that correspond to their zero control number which places them farthest from the Loran-C beacon band. This may be done be setting all of the registers at zero. Following that, the search steps (control numbers) for all of the pass filters are: zero, one, two, three and four. These step count control numbers initiate control words from the associated ROM to cause the pass filter to step up or down in frequency, depending on whether it is a low search or high search filter, toward the Loran-C band.

Operation is initiated by, for example, closing search start switch 53 which feeds clock pulses from clock 54 to search step counter 55 that counts to four and then resets to zero and so produces the control numbers: zero, one, two, three and four.

While a pass filter is stepped in search, its output from amplifier 103 is to system 108 of computer 120. System 108 includes interference detector 67, buffer 69 and from A/D converter 71. The digital number from converter 71 is the interference intensity number and is fed to "store previous sample" register 73 and to "compare present & previous" compare circuit 75, via gate 77, at each clock pulse from switch 53. Register 73 stores the intensity number that represents the previous sample and compare circuit 75 compares the present and the previous intensity numbers and, when the present sample exceeds the previous, the output of compare circuit 75 enables gate 79 that feeds the present count number from search step counter 55 to the register (41, 42, 43 and 44) for the filter.

Successive count sequences by counter 57 are denoted A, B, C and D. The A and B sequences for this example are for low band search and the C and D sequences are for high band searches. During a sequence, only the count register for that sequence is enabled and so can accept new numbers and while it is so enabled, it does not control the associated pass filter ROM. This may be accomplished by gates 114, denoted 45 to 48, that feed the register outputs to the ROMs 33 to 36 at sequence complementary intervals A*, B*, C* and D* from interval generator 81. Furthermore, during the sequence intervals A, B, C and D the ROMs are controlled by the step count numbers from step counter 55, each during its associated interval. This may be accomplished by gates 115, denoted 49 to 52 controlled by sequence intervals A, B, C and D from interval generator 81. In other words, during a sequence interval, the output of the register for that sequence is inhibited from controlling the associated pass filter ROM and the ROM is controlled instead by the count numbers output from step counter 55.

Search interval generator 81 may include several flip-flop and gate circuits responding to the reset or clear signal from search sequence counter 57. The output sequence interval signals from 81 are A, B, C and D and their complements A*, B*, C* and D*. During any of the sequences A, B, C or D, the corresponding register will change during the five step count of counter 55 whenever the present intensity number (representative of the present interference intensity detected), exceeds the immediately previous intensity number during the same sequence. Thus, the count number stored in the register will always represent the search frequency at which the greatest interference is detected during that count sequence. Upon completion of the four sequences A, B, C and D, in the event that are several interference signals detected below and several above the Loran-C band, all of the variable pass filters will be placed to reject a different interfering signal.

Waveforms shown in FIG. 9 illustrate clock pulses that define the intervals of the five search step count numbers zero, one, two, three and four of successive sequences A, B, C and D. Every fifth clock pulse clears the search step counter 55 and initiates a search sequence count by counter 57 and every fourth pulse from counter 57 clears it and is fed to interval generator circuit 81. The outputs of 81 are the sequences interval pulses denoted A, B, C and D in FIG. 9 and their complements.

During interval A, while the A low register 41 is being set, the B low register remains set at zero. Then, during the B low interval, register 42 is set. In order that register 42 not be set at the same step count control number as 41, the output of 41 during interval B eliminates the step count number from step counter 55 that is the same as the control number stored in 41. This is accomplished by compare circuit 83 which is enabled during the B interval and provides an output control to inhibit gate 85 that feeds step count numbers to the registers and to the pass filter ROMs. Likwise, in order that high register 44 not be set at the same control number as high register 43, the output of 43 during interval D eliminates the step count number from step counter 55 that is the same as the control number stored in 43. This may be accomplished by compare circuit 85 which is enabled during the D interval and provides an output control to inhibit gate 87.

The functions of compare circuit 75 that compares the present and precious signal intensity numbers during a pass filter sequence (A, B, C or D) and the functions of the compare circuits 83 and 83 that control inhibit gate 87 can be understood by reference to the waveforms in FIG. 9. The "first example" denoted "compare 75" illustrates the output of compare circuit 75 over the four sequences A, B, C and D that controls gate 79 which feeds step control numbers from counter 55, via inhibit gate 87, to the A, B, C and D count registers 41 to 44. This "first example" shows the output of compare circuit 75 indicating the step count numbers for for A, B, C and D of zero, one, two and four, respectively. These are denoted simply A=0, B=1, C=2 and D=4. As shown, the step count zero interval of B is missing (marked X), because inhibit gate 87 closed during that step count interval as the A register was storing a zero. Similarly, the count two interval of D is missing, because the C recister was storing a two.

The "second example" of "Compare 75" of waveforms in FIG. 9 shows several combinations of outputs of compare circuit 75 that all produce the sequences A=2, B=3, C=3 and D=2. These examples show a few of the number of different ways those sequences can be signalled from gate 79 to the registers and the ROMs.

As already mentioned, the frequency range 75 to 90 KHz below the Loran-C band and the frequency range 110 to 125 KHz above the band are searched for interfering signals during the search mode. Thus, in twenty steps each variable pass filter will have moved across a 15 KHz range. For purposes of example, consider the five steps in each 15 KHz range to be as follows:

Step zero—0 to 3 KHz
Step one—3 to 6 KHz
Step two—6 to 9 KHz
Step three—9 to 12 KHz
Step four—12 to 15 KHz During the cancel mode, pass filters 21 to 24 are controlled by their associated ROMs 33 to 36, respectively to place each of the low pass filters at frequencies between 90 and 75 KHz while each of the variable high pass filters are placed at frequencies between 125 and 110 KHz. Thus, the frequencies positions of the filters during the cancel mode are each at one of these steps as they are stepped through during the search mode.

Variable Narrow Band Pass Filters—Details

Figure 10:
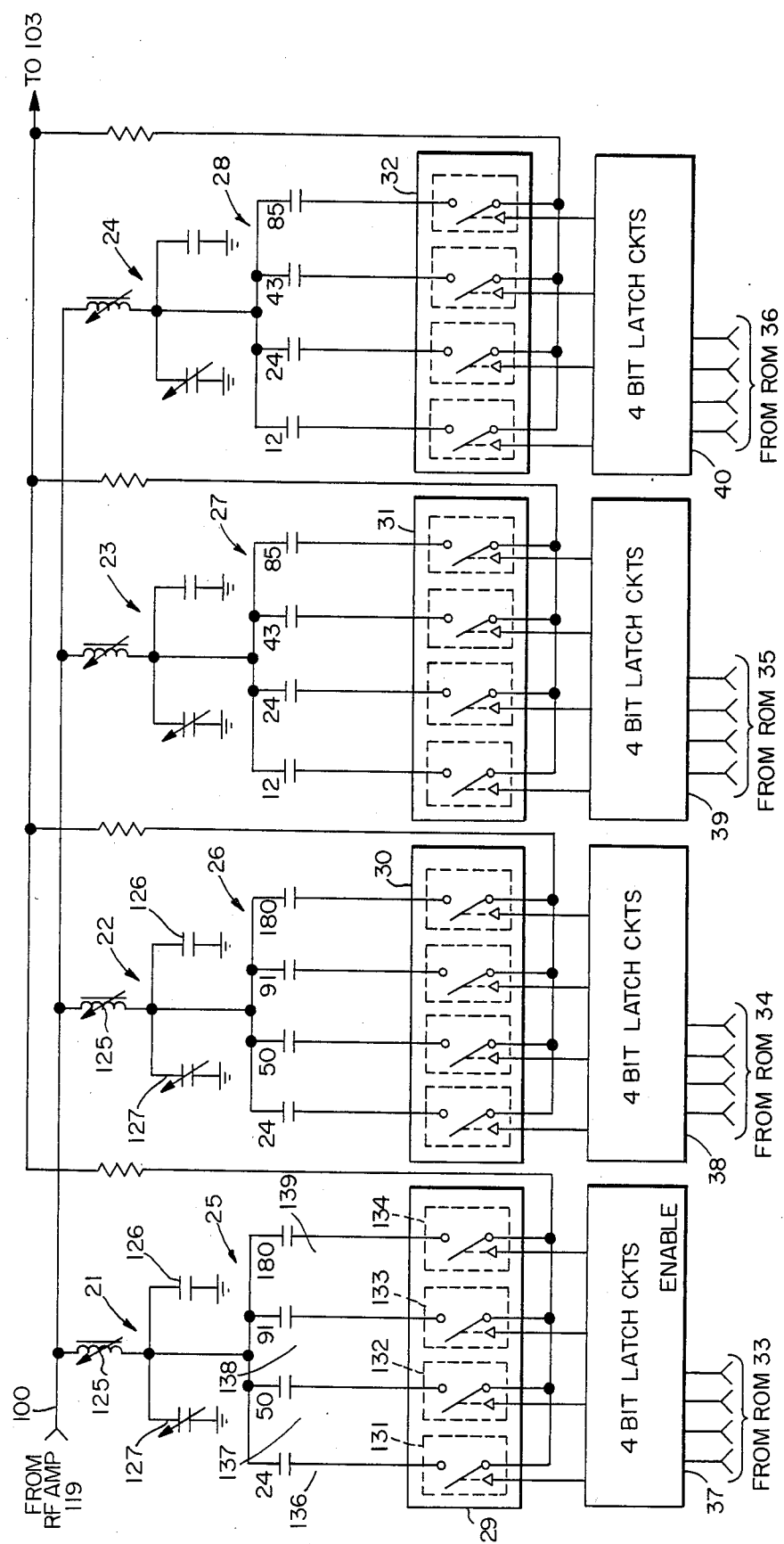
FIG. 10 is a circuit diagram of a portion of FIGS. 8a and 8b illustrating in detail the two low and two high pass filters, each with a bank of capacitors, a set of selector switches and latching circuits by which control numbers from the computer control the frequencies of the variable pass filters during the search and cancel modes.

Some circuit details of the variable narrow band pass filters 20 to 24 and their associated capacitor banks and sets of control switches are shown in FIG. 10. The pass filters are in parallel from the RF input to amplifier 103. The two low filters A and B, (21 and 22), each include an adjustable choke like 125 in filter 21, choke 125 is in series with selected fixed capacitors from C Bank 25, that are connected in parallel on the setting of control switches in 29, and those control switches are set by four bit latching circuits 37, depending on the control word fed to the latching circuits from the A Low ROM 33. The control word may be a four bit parallel binary number that sets the latches and they, in turn, set the four switches 131 to 134 in 29. For example, when switch 131 is closed capacitor 136 is in the parallel capacitor circuit 25. Similarly, each of the next capacitors in bank 25, capacitors 137, 138 and 139 are connected in parallel depending on whether the associated switch is open or closed. the value of capacitor 137 is about twice that of capacitor 136, the value of 138 is about twice 137 and the value of 139 is about twice 138. In this way, the capacitance of the pass filter 21 may be controlled in binary weighted increments by a binary parallel control word from ROM 33 and those numbers are such as to place the filter precisely at the desired narrow frequency band between 90 and 75 KHz below the Loran-C band.

The other reject filters 22, 23, and 24 operate in the same way. More particularly, the B Low filter 22, its associated C Bank 26, set of switches 30 and latching circuits 38 are constructed identical to those with filter 21 and, the C High and D High reject filters 23 and 24 and their C Banks, set of switches and latching circuits are constructed identical to each other. However, the capacitor values in the high pass filters are different from those in the low pass filters and this includes the capacitors within the associated C Bank, because they operate over the high range 125 to 110 KHz. Within a high filter C Bank the capacitor weighting is also substantially binary and each responds to a four bit binary word from its associated ROM, placing the high filters at the desired narrow frequency bands between 125 and 110 KHz above the Loran-C band.

Conclusions

The method and apparatus described herein include a technique for automatically searching and cancelling undesired or interfering narrow band signals in a broader band of received signals using analog or digital control signals to the search and cancelling circuits. A particular embodiment is described that incorporates this technique in a Loran-C receiver with digital control to searching and cancelling circuits so that undesired or interfering narrow band signals that usually occur along the edges of the Loran-C band are automatically searched for, located and cancelled. It is clear that the automatic searching and/or cancelling technique can be used in other receivers than a Loran-C receive. Also, the technique can be practiced using analog apparatus or a hybrid of analog and digital apparatus. Furthermore, various modifications and alterations of the processes and apparatus described herein can be made by those skilled in the art without deviating from the spirit and scope of the invention as set forth in the appended claims.

What is claimed is:

1. In a radio receiver for receiving desired signals in a predetermined frequency band and having means for eliminating a particular narrow frequency band of received signals among the desired signals in an electrical path in the receiver that has an input and an output, the improvement comprising,
   (a) a passive variable narrow band pass filter, tunable to the frequency of said undesired narrow band having an input and an output,
   (b) means for sampling signals in said electrical path at said input thereof and feeding said sample to said passive filter input,
   (c) means for reversing phase of the signals of said sample that reach the output of said passive filter,
   (d) means for combining said phase reversed signals with said electrical path output, producing a combined signal output and
   (e) said receiver electrical path input, said means for sampling, said passive filter and said means for reversing phase being coupled together in electrical series, in that order, herein called the series filter circuit,
   (f) said series filter circuit and said receiver electrical path being coupled electrically in parallel with the output of each coupled to said means for combining and
   (g) means for varying said passive filter to insure that said undesired signals are
   substantially eliminated from said received signals in said combined signal output.

2. In a radio receiver for receiving desired signals in a predetermined frequency band and having means for eliminating a particular narrow frequency band of received signals among the desired signals in an electrical path in the receiver that has an input and an output, the improvement comprising,
   (a) a passive variable narrow band pass filter, tunable to the frequency of said undesired narrow band having an input and an output,
   (b) means for sampling signals in said electrical path at said input thereof and feeding said sample to said passive filter input,
   (c) a phase reversing amplifier for receiving said passive filter output producing phase reversed signals, (d) means for combining said phase reversed signals with said electrical path output, producing a combined signal output, (e) said receiver electrical path input, said means for sampling, said passive filter and said phase reversing amplifier being coupled together in electrical series, in that order, herein called the series filter circuit, (f) said series filter circuit and said receiver electrical path being coupled electrically in parallel with the output of each coupled to said means for combining and (e) means for varying said passive filter to insure that said undesired signals are substantially eliminated from said received signals in said combined signal output.

3. In a radio receiver for receiving desired signals in a predetermined frequency band and having means for eliminating a particular narrow frequency band of received signals among the desired signals in an electrical path in the receiver that has an input and an output, the improvement comprising, (a) a passive variable narrow band pass filter, tunable to the frequency of said undesired narrow band having an input and an output, the resistive impedance of said pass filter having R1, (b) means for sampling signals in said electrical path at said input thereof and feeding said sample to said passive filter input, (c) a phase reversing amplifier for receiving said passive filter output producing phase reversed signals, the feedback impedance of said phase reversing amplifier being R3, whereby the gain of said phase reversing amplifier is R3/R1, (d) a summing amplifier for combining said phase reversed signals with said electrical path output, producing a combined signal output and (e) said receiver electrical path input, said means for sampling, said passive filter and said phase reversing amplifies being coupled together in electrical series, in that order, herein called the series filter circuit, (f) said series filter circuit and said receiver electrical path being coupled electrically in parallel with the output of each coupled to said means for combining and (g) means for varying said passive filter to insure that said undesired signals are substantially eliminated from said received signals in said combined signal output.

4. In a radio receiver for receiving desired signals in a predetermined frequency band and having means for eliminating a particular narrow frequency band of received signals among the desired signals in an electrical path in the receiver that has an input and an output, the improvement comprising, (a) a passive variable narrow band pass filter having resistive impedance and reactive impedance, tunable to the frequency of said undesired narrow band and having an input and an output, said resistive impedance of said passive filter being R1, (b) means for sampling signals in said electrical path at said input thereof and feeding said sample to said passive filter input, (c) a phase reversing amplifier for receiving said passive filter output producing phase reversed signals, the feedback impedance of said phase reversing amplifier being R3, whereby the gain of said phase reversing amplifier is R3/R1, (d) a summing amplifier for combining said phase reversed signals with said electrical path output, producing a combined signal output, (e) said receiver electrical path input, said means for sampling, said passive filter and said phase reversing amplifier being coupled together in electrical series, in that order, herein called the series filter circuit, (f) said series filter circuit and said receiver electrical path being coupled electrically in parallel with the output of each coupled to said means for combining and (g) the resistive impedance between said electrical path output and said summing amplifier being R4, (h) the resistive impedance between the output of said phase reversing amplifier and said summing amplifier being R5, (i) said passive filter is varied by varying said reactive impedance thereof and (j) R3/R1 and R4 and R5 are such that the undesired signals are substantially eliminated from the received signals in said combined signal output.

5. A radio receiver as in claim 1 wherein
(a) said passive filter includes reactive impedance and,
(b) said passive filter is varied by varying said reactive impedance thereof.

6. A radio receiver as in claim 1 wherein
(a) said passive filter includes capacitive impedance and,
(b) said passive filter is varied by varying said capacitive impedance thereof.

7. A radio receiver as in claim 1 wherein
(a) said passive filter includes inductive impedance and,
(b) said passive filter is varied by varying said inductive impedance thereof.

8. A radio receiver as in claim 5 wherein
(a) said reactive impedance is variable by a control signal,
(b) means are provided for detecting the signal level of said phase reversed signals and,
(c) a feedback system is provided responsive to said detected signal level for producing said control signal for varying said reactive impedance,
(d) whereby said passive filter frequency is varied by said control signal depending on said detected signal level.

9. A radio receiver as in claim 6 wherein
(a) said capacitive impedance is variable by a control signal,
(b) means are provided for detecting the signal level of said phase reversed signals and,
(c) a feedback system is provided responsive to said detected signal level for producing said control signal for varying said capacitive impedance,
(d) whereby said passive filter frequency is varied by said control signal depending on said detected signal level.

10. A radio receiver as in claim 7 wherein
(a) said inductive impedance is variable by a control signal,
(b) means are provided for detecting the signal level of said phase reversed signals and,
(c) a feedback system is provided responsive to said detected signal level for producing said control signal for varying said inductive impedance, (d) whereby said passive filter frequency is varied by said control signal depending on said detected signal level.

11. A radio receiver as in claim 9 wherein
   (a) said variable capactive impedance is a voltage variable diode and,
   (b) said control signal for varying is a voltage.

12. A radio receiver as in claim 9 wherein
   (a) said variable capacitive impedance includes capacitors selected from a bank of capacitors of binary weighted values,
   (b) switching means are provided for selecting combinations of capacitors from said bank of capacitors and connecting said selected combinations in circuit with said narrow band pass filter,
   (c) means are provided for producing search mode control signals for said switching means during a search mode that cause said passive filter to be tuned sequentially to predetermined narrow frequency bands
   (d) means responsive to said detected signal level during said search mode for selecting one of said search mode control signals and
   (e) means for applying said selected switching means control signals to said switching means during a cancel mode,
   (f) whereby said passive filter is varied by said control signal binary number when said undesired narrow frequency band varies.

13. A radio receive as in claim 10 wherein,
   (a) said variable inductive impedance includes inductors selected from a bank of inductors of binary weighted values,
   (b) switching means are provided for selecting combinations of inductors from said bank of inductors and connecting said selected combinations in circuit with said narrow band pass filter,
   (c) means are provided for producing search mode control signals for said switching means during a search mode that cause said passive filter to be tuned sequentially to predetermined narrow frequency bands
   (d) means responsive to said detected signal level during said search mode for selecting one of said search mode control signals and
   (e) means for applying said selected switching means control signal to said switching means during a cancel mode,
   (f) whereby said passive filler is varied by said control signal binary number when said undesired narrow frequency band varies.

14. A radio receiver as in claim 9 wherein
   (a) said variable capacitive impedance includes a voltage variable diode,
   (b) means are provided for producing search mode control signals for said voltage variable diode during a search mode that cause said passive filter to be tuned sequentially to predetermined narrow frequency bands,
   (d) means responsive to said detected signal level during said search mode for selecting one of said search mode control signals and
   (e) means for applying said selected search mode control signal to said voltage variable diode during a cancel mode,
   (f) whereby said passive filter is controlled by said selected control during said cancel mode to cancel said undesired signals.

15. A radio receiver as in claim 12 wherein,
   (a) said capacitors of a selected combination are connected in parallel with each other.

16. A radio receiver as in claim 13 wherein,
   (a) said inductors of a selected combination are connected in series with each other.

17. In a Loran receiver for receiving Loran beacon signals in a predetermined frequency band, means for reducing the effects of undesired rceived signals among the beacon signals in an electrical path having an input and an output in the Loran receiver comprising,
   (a) a passive variable narrow band pass filter, tunable to the frequency of said undesired narrow band having an input and an output,
   (b) means for sampling signals in said electrical path at said input thereof and feeding said sample to said passive filter input,
   (c) means for reversing phase of the signals of said sample that reach the output of said passive filter,
   (d) means for combining said phase reversed signals with said electrical path output, producing a combined signal output and
   (e) said Loran receiver electrical path input, said means for sampling, said passive filter and said means for reversing phase being coupled together in electrical series, in that order, herein called the series filter circuit,
   (f) said series filter circuit and said Loran receiver electrical path being coupled electrically in parallel with the output of each coupled to said means for combining and
   (g) means for varying said passive filter to insure that said undesired signals are substantially eliminated from said received signals in said combined signal output.

18. In a Loran receiver for receiving Loran beacon signals in a predetermined frequency band, means for reducing the effects of undesired received signals among the beacon signals in an electrical path having an input and an output in the Loran receiver comprising,
   (a) a passive variable narrow band pass filter, tunable to the frequency of said undesired narrow band having an input and an output,
   (b) means for sampling signals in said electrical path at said input thereof and feeding said sample to said passive filter input,
   (c) a phase reversing amplifier for receiving said passive filter output producing phase reversed signals,
   (d) means for combining said phase reversed signals with said electrical path output, producing a combined signal output and
   (e) said Loran receiver electrical path input, said means for sampling, said passive filter and said means for reversing phase being coupled together in electrical series, in that order, herein called the series filter circuit,
   (f) said series filter circuit and said Loran receiver electrical path being coupled electrically in parallel with the output of each coupled to said means for combining and
   (g) means for varying said passive filter to insure that said undesired signals are substantially eliminated from said received signals in said combined signal output.

19. In a Loran receiver for receiving Loran beacon signals in a predetermined frequency band, means for reducing the effects of undesired received signals among the beacon signals in an electrical path having an input and an output in the Loran receiver comprising,
(a) a passive variable narrow band pass filter, tunable to the frequency of said undesired narrow band having an input and an output, the resistive impedance of said passive filter having R1,
(b) means for sampling signals in said electrical path at said input thereof and feeding said sample to said passive filter input,
(c) a phase reversing amplifier for receiving said passive filter output producing phase reversed signals, the feedback impedance of said phase reversing amplifier being R3, whereby the gain of said phase reversing amplifier is R3/R1,
(d) a summing amplifier for combining said phase reversed signals with said electrical path output, producing a combined signal output and
(e) said Loran receiver electrical path input, said means for sampling, said passive filter and said phase reversing amplifier being coupled together in electrical series, in that order, herein called the series filter circuit,
(f) said series filter circuit and said Loran receiver electrical path being coupled electrically in parallel with the output of each coupled to said summing amplifier and
(g) means for varying said passive filter to insure that said undesired signals are substantially eliminated from said received signals in said combined signal output.

20. In a Loran receiver for receiving Loran beacon signals in a predetermined frequency band, means for reducing the effects of undesired received signals among the beacon signals in an electrical path having an input and an output in the Loran receiver comprising,
(a) a passive variable narrow band pass filter having resistive impedance and reactive impedance, tunable to the frequency of said undesired narrow band and having an input and an output, said resistive impedance of said passive filter being R1,
(b) means for sampling signals in said electrical path at said input thereof and feeding said sample to said passive filter input,
(c) a phase reversing amplifier for receiving said passive filter output producing phase reversed signals, the feedback impedance of said phase reversing amplifier being R3, whereby the gain of said phase reversing amplifier is R3/R1,
(d) a summing amplifier for combining said phase reversed signals with said electrical path output, producing a combined signal output,
(e) siad Loran receiver electrical path input, said means for sampling, said passive filter and said phase reversing amplifier being coupled together in electrical series, in that order, herein called the series filter circuit,
(f) said series filter circuit and said Loran receiver electrical path being coupled electrically in parallel with the output of each coupled to said summing amplifier and
(g) means for varying said passive filter to insure that said undesired signals are substantially eliminated from said received signals in said combined signal output.
(h) the resistive impedance between said electrical path output and said summing amplifier being R4,
(i) the resistive impedance between the output of said phase reversing amplifier and said summing amplifier being R5,
(j) said passive filter is varied by varying said reactive impedance thereof and
(k) R3/R1 and R4 and R5 are such that the undesired signals are substantially eliminated from the received signals in said combined signal output.

21. A Loran receiver as in claim 17 wherein
(a) said passive filter includes reactive impedance and,
(b) said passive filter is varied by varying said reactive impedance thereof.

22. A Loran receiver as in claim 17 wherein
(a) said passive filter includes capacitive impedance and,
(b) said passive filter is varied by varying said capacitive impedance thereof.

23. A Loran receiver as in claim 17 wherein
(a) said passive filter includes inductive impedance and,
(b) said passive filter is varied by varying said inductive impedance thereof.

24. A Loran receiver as in claim 21 wherein
(a) said reactive impedance is variable by a control signal,
(b) means are provided for detecting the signal level of said phase reversed signals and,
(c) a feedback system is provided responsive to said detected signal level for producing said control signal for varying said reactive impedance,
(d) whereby said passive filter frequency is varied by said control signal depending on said detected signal level.

25. A Loran receiver as in claim 22 wherein
(a) said capacitive impedance is variable by a control signal,
(b) means are provided for detecting the signal level of said phase reversed signals and,
(c) a feedback system is provided responsive to said detected signal level for producing said control signal for varying said capacitive impedance,
(d) whereby said passive filter frequency is varied by said control signal depending on said detected signal level.

26. A Loran receiver as in claim 23 wherein
(a) said inductive impedance is variable by a control signal,
(b) means are provided for detecting the signal level of said phase reversed signals and,
(c) a feedback system is provided responsive to said detected signal level for producing said control signal for varying said inductive impedance,
(d) whereby said passive filter frequency is varied by said control signal depending on said detected signal level.

27. A Loran receiver as in claim 25 wherein
(a) said variable capacitive impedance is a voltage variable diode and,
(b) said control signal for varying is a voltage.

28. A Loran receiver as in claim 25 wherein
(a) said variable capacitive impedance includes capacitors selected from a bank of capacitors of binary weighted values,
(b) switching means are provided for selecting combinations of capacitors from said bank of capacitors and connecting said selected combinations in circuit with said passive filter, (c) means are provided for producing search mode control signals for said switching means during a search mode that cause said passive filter to be tuned sequentially to predetermined narrow frequency bands (d) means responsive to said detected signal level during said search mode for selecting one of said search mode control signals and (e) means for applying said selected switching means control signals to said switching means during a cancel mode, (f) whereby said passive filter is varied by said control signal binary number when said undesired narrow frequency band varies.

29. A Loran receiver as in claim 17 wherein said passive variable narrow band pass filter includes capacitive impedance that is variable and is comprised of capacitors selected from a pass filter capacitor bank including a multitude of fixed capacitors, the selection being such that the center frequency of the said passive filter varies depending upon the selection of capacitors from the bank.

30. A Loran receiver as in claim 28 wherein,
(a) the capacitor in the said passive filter capacitor bank all electrically connected in parallel to each other,
(b) capacitor switching means is provided for each capacitor of said band and
(c) means are provided for controlling said switching means for each successive group so that selected capacitors of the group are combined in series to increment the variable capacitance of the said passive filter in binary multiples from group to group.

31. A Loran receiver as in claim 30, wherein,
(a) means are provided for storing binary digital numbers for controlling said capacitor switching means and
(b) each of the binary bits of each of said binary numbers controls the switch for a different on of said capacitors,
(c) whereby said stored numbers represent the increment to the variable capcitance of said passive filter.

32. A Loran receiver as in claim 31 wherein each of said stored binary numbers represents a center frequency of said passive filter and when applied to said capacitor switching means causes an increment to said variable capacitance of said passive filter that causes the center frequency thereof to be substantially at said frequency represented by said number.

33. In a Loran receiver for receiving Loran beacon signals in a predetermined frequency band, the method of reducing undesired received signals among the beacon signals in an electrical path in the Loran receiver including the steps of:
(a) detecting the presence of the undesired signals among the received beacon signals in the electrical path in the Loran receiver and producing an output representative of the frequency of detected undesired signals,
(b) sampling the undesired received signals with a passive variable narrow band pass filter of band width substantially less that the frequency band containing the beacon signals, in said electrical path in the Loran receiver, and
(c) reversing the phase of the undesired received signals from the output of said passive filter and (d) combining said reversed phase signals with said received signals in the electrical path and
(e) varying said passive filter to insure that said undesired signals are substantially cancelled in said electrical path in the Loran receiver.

34. In a Loran receiver for receiving Loran beacon signals in a predetermined frequency band and having an RF section with means for reducing the effects of undesired received signals among the beacon signals in a portion of the frequency band of said received signals including a variable narrow band pass filter that is tunable to different narrow bands of frequency in said portion of the frequency band of said received signals and means for sampling said received signals and feeding said sample to said variable narrow band said pass filter input, means for identifying the maximum undesired received signal among said undesired received signals and tuning said variable narrow band pass filter to said identified maximum undesired received signals, comprising,
(a) means for generating variable narrow band pass filter frequency control signals,
(b) means for applying said control signals sequentially to said variable narrow band pass filter,
(c) whereby said said variable narrow band pass filter is sequentially tuned to successive narrow frequency bands across said portion of the frequency band of said received signals and produces an output signal that corresponds to one of said control signals,
(d) means for comparing the present magnitude of the output of said variable narrow band pass filter at each of said sequential tunings with the magnitude of the output of said variable narrow band pass filter at a previous of said sequential tunings,
(e) means responsive to said comprising means for storing said control signal that corresponds to said present output when said present output magnitude exceeds said previous output magnitude and
(f) means for applying said stored control signal to said variable narrow band pass filter.

35. In a Loran receiver for receiving Loran beacon signals in a predetermined frequency band and having an RF section with means for reducing the effects of undesired received signals among the beacon signals in a portion of the frequency band of said received signals including two variable narrow band pass filters that are each tunable to the same different narrow bands of frequency in said portion of the frequency band of said received signals and means for sampling said received signals and feeding said sample to each of said variable narrow band said pass filter inputs, means for identifying said undesired received signal among said undesired received signals and sequentially tuning first one and then the other of said variable narrow band pass filters to different of said identified undesired received signals, comprising,
(a) means for generating variable narrow band pass filter frequency control signals,
(b) means for applying said control signals sequentially first to one of said variable narrow band pass filters and then to the other,
(c) whereby first said one variable narrow band pass filter is sequentially tuned to successive narrow frequency bands across said portion of the frequency band of said received signals and produces an output signal that corresponds to one of said control signals and then the other of said variable narrow band pass filter is sequentially tuned to successive narrow frequency bands across said portion of the frequency band of said received signals and produces an output signal that corresponds to one of said control signals, (d) means for storing said control signal for said one variable narrow band pass filters following said successive tuning thereof, (e) means for comparing said stored control signal with said control signals successively applied to said other variable narrow band pass filter and (f) means responsive thereto for eliminating from among said successively applied control signals those that are the same as said stored control signal.

36. A narrow band pass notch filter centered at a radio frequency F in an electrical path for radio frequency signals that has an input and an output, comprising, (a) a passive variable relatively wider band pass filter, tunable to said frequency F having an input and an output, (b) means for sampling signals in said electrical path at said input thereof and feeding said sample to said passive filter input, (c) phase reversing means for receiving said passive filter output producing phase reversed signals, (d) means for combining said phase reversed signals with said electrical path output, producing a combined signal output, (e) said electrical path input, said means for sampling, said passive filter and said phase reversing means being coupled together in electrical series, in that order, herein called the series filter circuit, (f) said series filter circuit and said electrical path being coupled electrically in parallel with the output of each coupled to said means for combining and (g) means for varying said passive filter whereby a narrow band notch at the frequency F is in the frequency spectrum of radio frequency signals from said combining means.

37. A notch filter as in claim 36 wherein, (a) the resistive impedance of said passive filter is R1, (c) said phase reversing means is a phase reversing amplifier having a feedback impedance R3, whereby the gain of said phase reversing amplifier is R3/R1 and (d) said combining means is a summing amplifier for combining said phase reversed signals with said electrical path output, producing said combined signal output.

38. A notch filter as in claim 37 wherein, (a) the resistive impedance between said electrical path output and said summing amplifier is R4, (b) the resistive impedance between the output of said phase reversing amplifier and said summing amplifier is R5 and, (c) R3/R1 and R4 and R5 are such that a narrow band notch at the frequency F is in the frequency spectrum of radio frequency signals from said combining means.

39. A notch filter as in claim 36 wherein, (a) said passive filter includes reactive impedance and, (b) said passive filter is varied by varying said reactive impedance, (c) whereby said passive filter frequency band is varied to vary F.

40. A notch filter as in claim 36 wherein, (a) said passive filter include capacitive impedance and, (b) said passive filter is varied by varying said capacitive impedance, (c) whereby said passive filter frequency band is varied to vary F.

41. A notch filter as in claim 36 wherein, (a) said passive filter includes inductive impedance and, (b) said passive filter is varied by varying said inductive impedance, (c) whereby said passive filter frequency band is varied to vary F.

42. A notch filter as in claim 39 wherein (a) said reactive impedance is variable by a control signal, (b) means are provided for detecting the signal level of said phase reversed signals and, (c) a feedback system is provided responsive to said detected signal level for producing said control signal for varying said reactive impedance, (d) whereby F is varied by said control signal depending on said detected signal level.

43. A notch filter as in claim 40 wherein (a) said capacitive impedance is variable by a control signal, (b) means are provided for detecting the signal level of said phase reversed signals and, (c) a feedback system is provided responsive to said detected signal level for producing said control signal for varying said capacitive impedance, (d) whereby F is varied by said control signal depending on said detected signal level.

44. A notch filter as in claim 41 wherein (a) said inductive impedance is variable by a control signal, (b) means are provided for detecting the signal level of said phase reversed signals and, (c) a feedback system is provided responsive to said detected signal level for producing said control signal for varying said inductive impedance, (d) whereby F is varied by said control signal depending on said detected signal level.

45. A notch filter as in claim 40 wherein (a) said variable capacitive impedance is a voltage variable diode and, (b) said control signal for varying is a voltage.

46. A notch filter as in claim 40 wherein (a) said variable capacitive impedance includes capacitors selected from a bank of capacitors of binary weighted values, (b) switching means are provided for selecting combinations of capacitors from said bank of capacitors and connecting said selected combinations in circuit with said passive filter, (c) means are provided for producing search mode control signals for said switching means during a search mode that cause said passive filter to be tuned sequentially to predetermined frequency bands (d) means responsive to said detected signal level during said search mode for selecting one of said search mode control signals and (e) means for applying said selected switching means control signals to said switching means during a cancel mode, (f) whereby F is varied by said control signal binary number so that said notch is at an undesired narrow frequency band.

47. In a radio receiver for receiving desired signals in a predetermined frequency band and having means for eliminating a particular narrow frequency band of received signals among the desired signals in an electrical path in the receiver that has an input and an output, the improvement comprising,
  (a) a passive variable narrow band pass filter, tunable to the frequency of said undesired narrow band having an input and an output,
  (b) means for sampling signals in said electrical path at said input thereof and feeding said sample to said passive filter input,
  (c) means for subtracting the signals of said sample that reach the output of said passive filter from said electrical path output, producing a net signal output and
  (e) said radio receiver electrical path input, said means for sampling and said passive filter being coupled together in electrical series, in that order, herein called the series filter circuit,
  (f) said series filter circuit and said radio receiver electrical path being coupled electrically in parallel with the output of each coupled to said means for subtracting signals and
  (g) means for varying said passive filter to insure that said undesired signals are substantially eliminated from said received signals in said net signal output.

48. A radio receiver as in claim 47 wherein
  (a) said passive filter includes reactive impedance and,
  (b) said passive filter is varied by varying said reactive impedance thereof.

49. A radio receiver as in claim 47 wherein
  (a) said passive filter includes capacitive impedance and,
  (b) said passive filter is varied by varying said capacitive impedance thereof.

50. A radio receiver as in claim 47 wherein
  (a) said passive filter includes inductive impedance and,
  (b) said passive filter is varied by varying said inductive impedance thereof.

51. A radio receiver as in claim 48 wherein
  (a) said reactive impedance is variable by a control signal,
  (b) means are provided for detecting the signal level of said signals of said sample that reach the output of said passive filter and
  (c) a feedback system is provided responsive to said detected signal level for producing said control signal for varying said reactive impedance,
  (d) whereby said passive filter frequency is varied by said control signal depending on said detected signal level.

* * * * *